US008879593B2

(12) United States Patent
Kim et al.

(10) Patent No.: US 8,879,593 B2
(45) Date of Patent: Nov. 4, 2014

(54) EPITAXIAL-SIDE-DOWN MOUNTED HIGH-POWER SEMICONDUCTOR LASERS

(71) Applicants: Chul Soo Kim, Springfield, VA (US); William W. Bewley, Falls Church, VA (US); Mijin Kim, Springfield, VA (US); Charles D. Merritt, Fairfax, VA (US); Chadwick Lawrence Canedy, Washington, DC (US); Joshua Abell, University Park, MD (US); Igor Vurgaftman, Odenton, MD (US); Jerry R. Meyer, Catonsville, MD (US)

(72) Inventors: Chul Soo Kim, Springfield, VA (US); William W. Bewley, Falls Church, VA (US); Mijin Kim, Springfield, VA (US); Charles D. Merritt, Fairfax, VA (US); Chadwick Lawrence Canedy, Washington, DC (US); Joshua Abell, University Park, MD (US); Igor Vurgaftman, Odenton, MD (US); Jerry R. Meyer, Catonsville, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 54 days.

(21) Appl. No.: 13/802,887

(22) Filed: Mar. 14, 2013

(65) Prior Publication Data

US 2013/0243020 A1  Sep. 19, 2013

Related U.S. Application Data

(60) Provisional application No. 61/611,800, filed on Mar. 16, 2012.

(51) Int. Cl.
*H01S 3/04* (2006.01)
*H01S 5/024* (2006.01)
(Continued)

(52) U.S. Cl.
CPC ............... *H01S 5/024* (2013.01); *H01S 5/022* (2013.01); *H01S 5/0224* (2013.01); *H01S*
(Continued)

(58) Field of Classification Search
CPC ... H01S 5/005; H01S 5/0224; H01S 5/02248; H01S 5/02268; H01S 5/02272; H01S 5/183; H01S 5/22
USPC .................................................. 372/44.01, 36
See application file for complete search history.

(56) References Cited

U.S. PATENT DOCUMENTS 7,502,397 B2 *  3/2009  Naganuma ...................... 372/36
2011/0085577 A1 *  4/2011  Krasulick et al. .......... 372/45.01

OTHER PUBLICATIONS

K.V.S.S.S.S. Sairam, Optical Communications, Laxmi Publications (2007), at p. 72.

(Continued)

*Primary Examiner* — Tuan Nguyen
(74) *Attorney, Agent, or Firm* — US Naval Research Laboratory; Joslyn Barritt (57) ABSTRACT

A laser apparatus configured for epitaxial-side-down mounting on a heat sink. The laser apparatus includes a semiconductor laser structure and at least one post on a substrate where the laser structure and post are separated from each other by a channel. The laser structure and the posts optionally are coated with a heat-spreading material layer and are configured so that the maximum height of the posts is about the same as the maximum height of the laser structure. When the laser apparatus is mounted to a heat sink in an epi-down configuration using solder applied to the top of the laser structure and the at least one post, the channels between the at least one post and the laser structure provide a relief flow path for the solder and ensure that the laser structure does not come directly into contact with the solder.

23 Claims, 11 Drawing Sheets

(51) Int. Cl.
  *H01S 5/022* (2006.01)
  *H01S 5/00* (2006.01)
  *H01S 5/183* (2006.01)
  *H01S 5/22* (2006.01)

(52) U.S. Cl.
  CPC  5/02268 (2013.01); *H01S 5/02272* (2013.01); *H01S 5/005* (2013.01); *H01S 5/02248* (2013.01); *H01S 5/02469* (2013.01); *H01S 5/183* (2013.01); *H01S 5/22* (2013.01); *H01S 2301/176* (2013.01)
  USPC .......................................................... 372/36

(56) References Cited

OTHER PUBLICATIONS

Doug Hodgson and Bill Olsen, "Protecting Your Laser Diode" Newport Corporation Application Note (2003), at p. 9.

J. Abell, C.S. Kim, W.W. Bewley, C.D. Merritt, C.L. Canedy, I. Vurgaftman, J.R. Meyer, and M. Kim, "Mid-infrared interband cascade light emitting devices with milliwatt output powers at room temperature," Appl. Phys. Lett. 104, 261103 (2014).

C.L. Canedy, J. Abell, C.D. Merritt, W.W. Bewley, C.S. Kim, M. Kim, I. Vurgaftman, and J.R. Meyer, "Pulsed and CW Performance of 7-Stage Interband Cascade Lasers," Opt. Expr. 22, 7702 (2014).

W.W. Bewley, C.S. Kim, C.L. Canedy, C.D. Merritt, I. Vurgaftman, J. Abell, J.R. Meyer and M. Kim, "High-Power, High-Brightness Continuous-Wave Interband Cascade Lasers with Tapered Ridges," Appl. Phys. Lett. 103, 111111 (2013).

I. Vurgaftman, W.W. Bewley, C.L. Canedy, C.S. Kim, M. Kim, C.D. Merritt, J. Abell, and J.R. Meyer, "Interband Cascade Lasers with Low Threshold Powers and High Output Powers," IEEE J. Sel. Topics Quant. Electron. 19, 1200120 (2013).

W.W. Bewley, C.L. Canedy, C.S. Kim, M. Kim, C.D. Merritt, J. Abell, I. Vurgaftman, and J.R. Meyer, "High-Power Room-Temperature Continuous-Wave Mid-Infrared Interband Cascade Lasers," Opt. Expr. 20, 20894 (2012).

\* cited by examiner

EPITAXIAL-SIDE-DOWN MOUNTED HIGH-POWER SEMICONDUCTOR LASERS

CROSS-REFERENCE

This application is a Nonprovisional of and claims the benefit of priority under 35 U.S.C. §119 based on U.S. Provisional Patent Application No. 61/611,800 filed on Mar. 16, 2012, the entirety of which is hereby incorporated by reference into the present application.

TECHNICAL FIELD

The present invention relates to semiconductor lasers operating at high input and output powers, and in particular to heat management and heat dissipation in such semiconductor lasers.

BACKGROUND

In order to produce a high output power, semiconductor lasers must be operated either significantly above the lasing threshold or employ a large active area that produces gain. In both circumstances, heat dissipation from Joule heating becomes an overriding concern since, generally, the laser efficiency decreases substantially as the temperature of the active region increases. It is therefore beneficial to position a heat sink comprising a material with relatively high thermal conductivity (such as a noble metal or diamond) as close as possible to the epitaxial surface of the laser so that it can spread the heat away from the active region, minimizing the temperature increase.

A laser apparatus can be mounted to a heat sink either epitaxial-side-up ("epi-up"), with the substrate side of the laser apparatus mounted on the heat sink, or epitaxial-side-down ("epi-down"), with the active epitaxial side of the laser chip mounted directly to the heat sink.

Figure 1A:
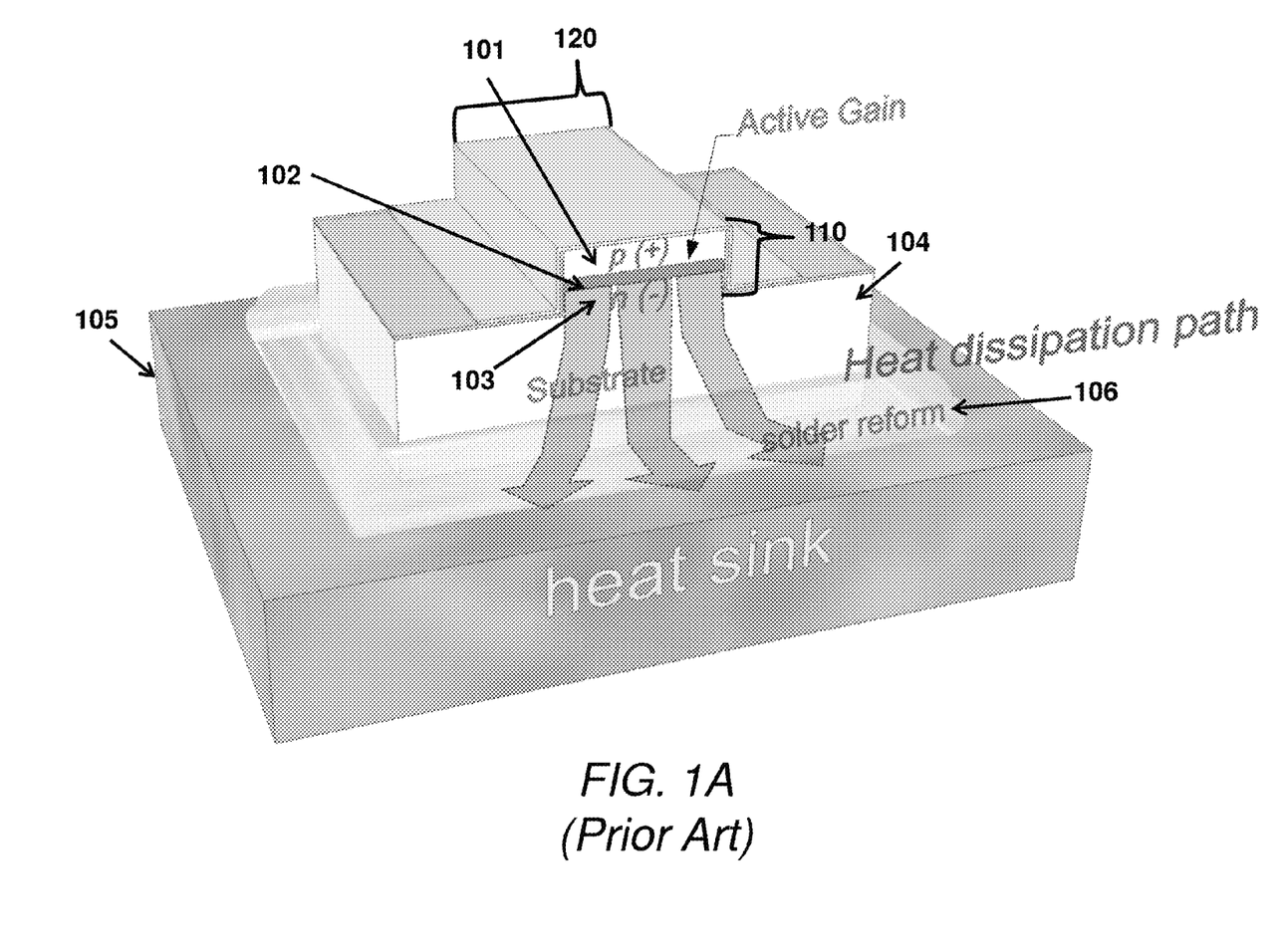
FIGS. 1A-1C depict conventional semiconductor ridge laser mounting configurations in accordance with the prior art, with FIGS. 1A and 1B depicting illustrative conventional epi-up configurations and FIG. 1C depicting an illustrative conventional epi-side-down configuration.
Figure 1B:
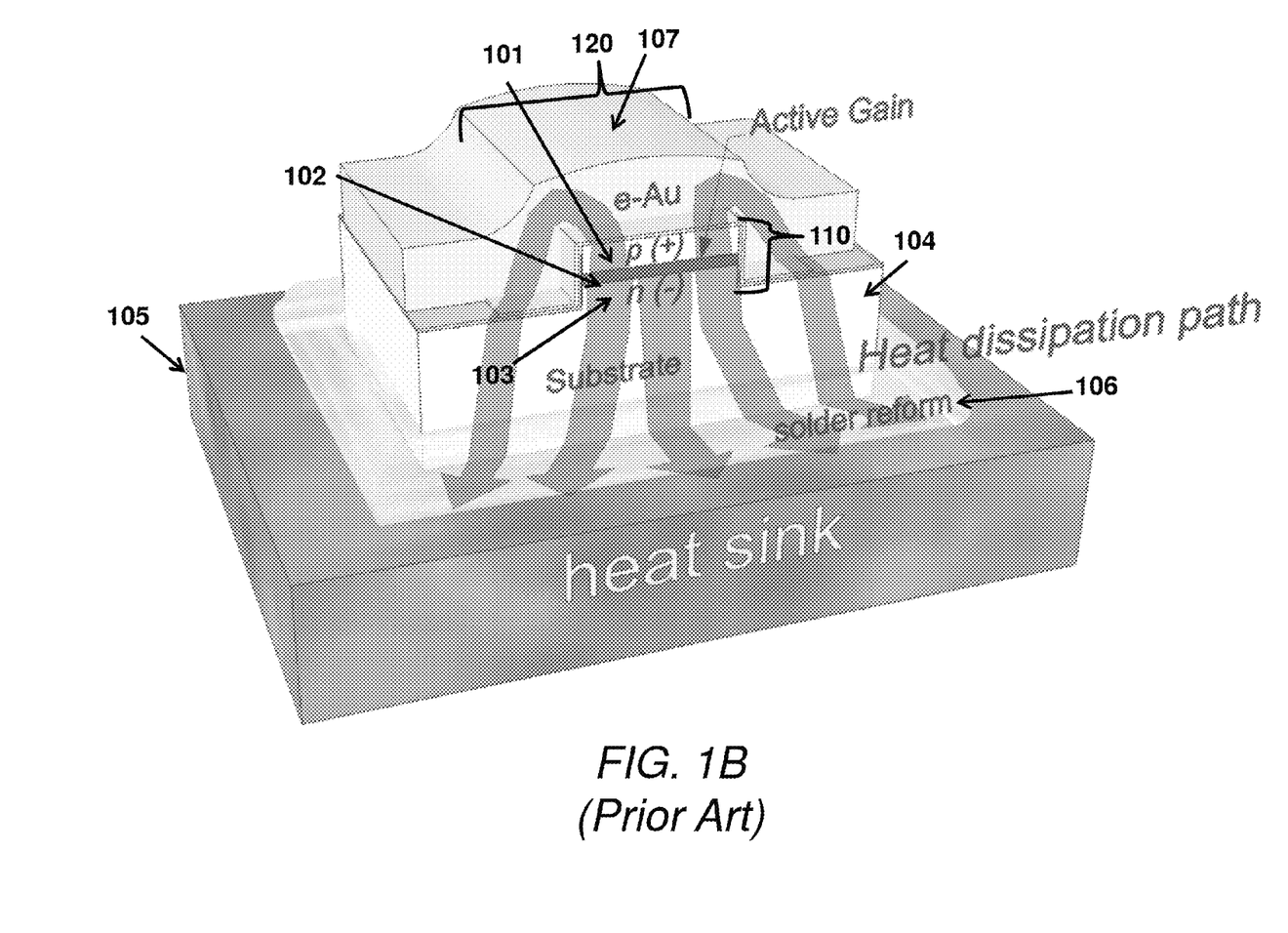

FIGS. 1A and 1B illustrate exemplary configurations of conventional epi-up ridge waveguide lasers in accordance with the prior art. As shown in FIGS. 1A and 1B, a typical semiconductor laser includes p(+) top optical clad/Active Gain/n(-) bottom optical clad layers 101/102/103, respectively. These layers, which constitute the laser portion of the chip, are grown on a substrate 104 and are patterned into a laser ridge 120. In the exemplary devices shown in FIGS. 1A, 1B, and 1C, the n(+) region is closest to the substrate, though in other configurations, the p(+) region may be closest.

In an epi-up configuration, the substrate is secured to a high thermal conductivity heat sink 105. As shown in FIG. 1A, heat from the laser (i.e., layers 101-103) flows through substrate 104 and the solder 106 and dissipates into heat sink 105. However, epi-up mounting of the laser chip does not provide the most efficient dissipation of the generated heat. This is because the heat dissipation path that must traverse the substrate tends to have a high thermal resistance, since the distance to the heat sink is quite long and the substrate thermal conductivity is generally much lower than that of the heat sink material.

The heat dissipation in an epi-up ridge laser configuration can be improved somewhat by a layer of heat-spreading material 107, typically a 3-5 µm thick layer of electroplated gold (e-Au), deposited on top of laser ridge 120, as shown in FIG. 1B. Since only the top cladding 101 separates the gold from the active region, the heat will diffuse (primarily vertically, but also to some extent laterally for narrow ridges) toward and into the electroplated layer 107, although it must still traverse the substrate 104 before it reaches heat sink 105. While this approach can significantly reduce the thermal resistance as compared to epi-up mounting without the gold electroplating, it is still far from ideal since the thin layer of gold has far less capacity to dissipate the heat than a heat sink comprising a thick layer of heat-spreading material.

Figure 1C:
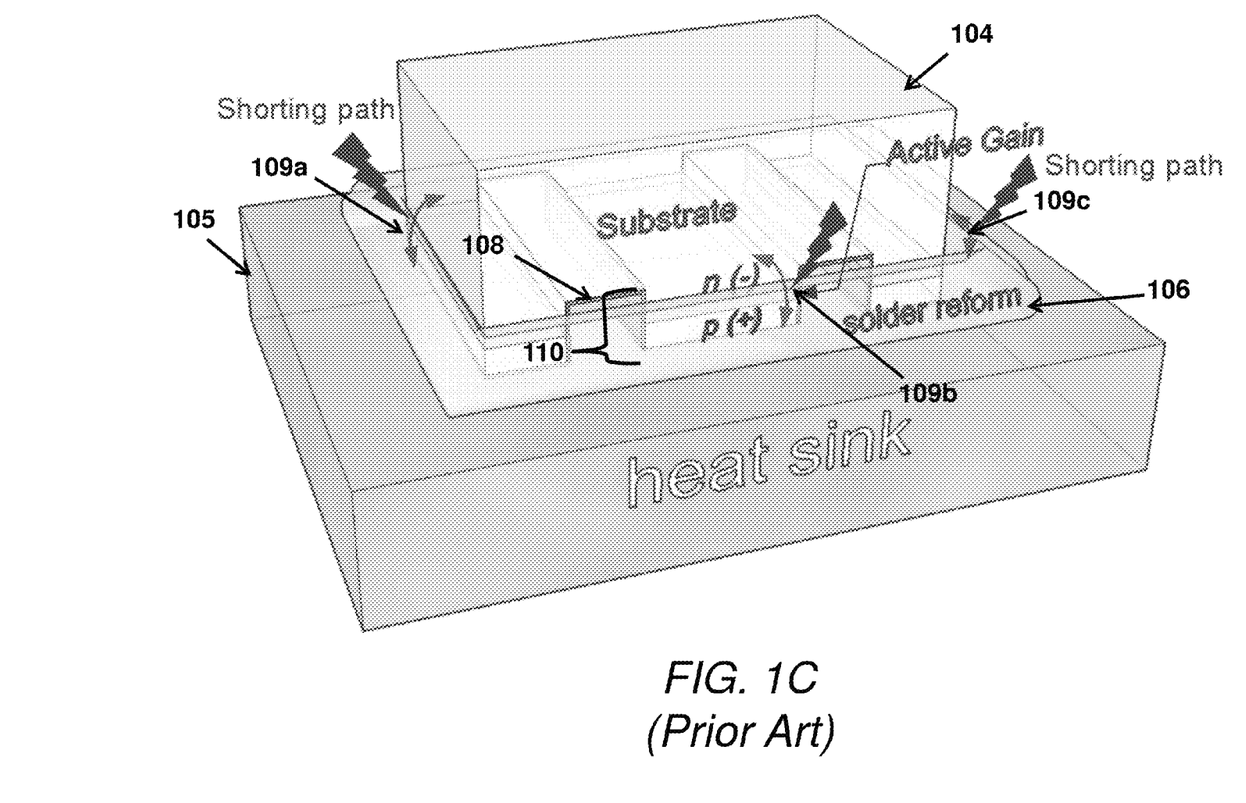

FIG. 1C illustrates an exemplary epi-down mounting arrangement. As shown in FIG. 1C, in an epi-down mounting arrangement the laser 101-103 side of the chip is mounted directly to the heat sink 105, with the substrate 104 being "on top." Such a mounting configuration, which may also optionally incorporate an e-Au layer between the laser and the heat sink, is much more effective to dissipate heat because it places the heat sink 105 in the immediate vicinity of the laser's active region. Epi-down mounting decreases heating in the active gain regions 102 of both narrow and wide laser ridges, and is especially useful for lasers having wide ridges because the heat conduction is mostly in the vertical direction.

As illustrated in FIG. 1C, to maintain mechanical stability in an epi-down mounting configuration, the laser ridge is typically defined by narrow trenches 108 etched in the chip, with laser facets 110 defining the longitudinal dimensions of the trenches. The laser apparatus is typically secured to the heat sink by means of indium or gold-tin alloy solders which form a thermal bond between the laser and the heat sink. However, when pressure is applied to secure a thin, uniform solder joint, any excess molten solder must flow out of the region between the two bonded layers, collecting as solder reform 106 shown in FIGS. 1A/1B/1C. This escaping solder often ends up on the laser facets or on the sidewalls of the substrate, thereby blocking the light emission or shorting the device, e.g., via shorting paths 109a/109b/109c shown in FIG. 1C, because the solder is electrically conductive.

One approach to control the flow of the solder is to pattern the heat sink with relief areas where the escaping solder may accumulate. While this may sometimes be effective, it suffers from the impracticality of having to pattern the heat sink to conform to a particular laser chip size and geometry. Because it can be extremely challenging to fully control the disposition of the flowing solder, even in mature diode laser packaging facilities the yield of good devices is often degraded by shorting, blocking, or inadequate thermal bonding in some fraction of the mounted lasers. At the other extreme, personnel who have not developed the considerable expertise required for effective epi-down mounting may experience very low or even zero yields.

The present invention solves these problems by providing, with high yield, an improved epi-down structure which relieves the pressure on the solder.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides an improved laser apparatus configured for epitaxial-side-down mounting to a heat sink or other substrate.

In accordance with an exemplary embodiment of the present invention, the laser apparatus includes a semiconductor ridge or surface-emitting laser on a substrate and further includes one or more posts distributed periodically on one or both sides of the laser ridge, separated from the laser ridge and from each other by a series of channels situated therebetween. The posts may consist of semiconductor material fabricated by etching the chip, may comprise another material deposited onto the chip, or they may comprise materials formed by a combination of these two methods. A dielectric layer is deposited on top of the posts to prevent current flow. The laser ridge and the posts are then coated with a top contact metal layer and, optionally, a layer of heat-spreading material, typically electroplated gold, and are configured so that the maximum height of the posts is about the same as the maximum height of the laser ridge. The laser apparatus is mounted to a heat sink in an epi-down configuration using solder applied to the top of the laser ridge and the posts. Because the height of the posts is greater than the thickness of the solder, the channels between the posts and between the posts and the laser ridge provide a relief flow path for the excess molten solder, and this ensures that neither the cleaved sidewalls of the chip nor the laser facet directly contacts the solder, preventing the solder from interfering with the operation of the device. In addition, the presence of the posts provides mechanical stability and improved alignment for the epi-down mounted laser ridge.

In alternative embodiments, the invention may be used with other semiconductor laser architectures such as vertical-cavity surface-emitting lasers (VCSELs), vertical-external-cavity surface-emitting lasers (VECSELs), optically-pumped semiconductor lasers employing either an edge-emitting or surface-emitting geometry, light-emitting diodes (LEDs) that emit from the surface or edge, gain-guided semiconductor lasers, semiconductor optical amplifiers, semiconductor superluminescent emitters, arrays of edge-emitters or surface-emitters bonded epitaxial-side-down to a substrate that may or may not function as a heat sink. In embodiments of the invention used with VCSELs and VECSELs, the posts may be situated outside of the active gain region, and such posts can provide a pathway for the flow of excess solder and can also improve the mechanical stability of the device.

In other cases, epitaxial-side-down mounting in accordance with the present invention may be used to integrate a semiconductor laser device onto a chip whose primary role is not to serve as a heat sink but which contains other devices, for example, in bonding a III-V diode laser to a silicon chip for a silicon photonics optoelectronic system.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

As noted above, conventional epi-up laser mounting does not provide satisfactory dissipation of the generated heat, while conventional epi-down mounting often results in the light emission being blocked or the device being shorted.

The present invention solves these problems by providing an improved laser apparatus configured for epi-down mounting to a heat sink or other surface.

Although the present disclosure describes the invention primarily in the context of edge-emitting, electrically-pumped semiconductor lasers employing a ridge waveguide geometry, the invention can also be used with other semiconductor laser architectures such as vertical-cavity surface-emitting lasers (VCSELs), vertical-external-cavity surface-emitting lasers (VECSELs), optically-pumped semiconductor lasers employing either an edge-emitting or surface-emitting geometry, light-emitting diodes (LEDs) that emit from the surface or edge, gain-guided semiconductor lasers, semiconductor optical amplifiers, semiconductor superluminescent emitters, and arrays of edge-emitters or surface-emitters to bond them epitaxial-side-down to a substrate that may or may not function as a heat sink. In other cases, epitaxial-side-down mounting in accordance with the present invention may be used to integrate a semiconductor laser device onto a chip whose primary role is not to serve as a heat sink but which contains other devices, for example, in bonding a III-V diode laser to a silicon chip for a silicon photonics optoelectronic system.

These and other aspects of the present invention will now be described in the context of the Figures filed herewith, which form a part of the present disclosure.

As described in more detail below, one embodiment of a laser apparatus in accordance with the present invention includes a semiconductor laser ridge on a substrate and further includes one or more posts distributed periodically on one or both sides of the laser chip, separated from the laser ridge and from each other by a series of channels situated therebetween. The posts may consist of semiconductor material fabricated by etching the chip, may consist of another material deposited onto the chip, or may consist of materials formed by a combination of these two methods. A dielectric layer is deposited on top of the posts to prevent current flow. The laser ridge and the posts are then coated with a top contact metal layer and, optionally, a layer of heat-spreading material, typically electroplated gold, and are configured so that the maximum height of the posts is about the same as the maximum height of the laser ridge. When the laser apparatus is mounted to a heat sink in an epi-down configuration using solder applied to the top of the laser ridge and the posts, the channels between the posts and between the posts and the laser ridge provide a relief flow path for the molten solder, i.e., an adequate initially empty volume for the volume of solder displaced by the ridge and posts to occupy and flow through without contacting the sidewalls of the chip. This relief flow path, along with the top contact metal layer, ensures that the semiconductor chip does not come directly into contact with the solder, preventing the solder from interfering with the operation of the device. In addition, the presence of the posts provides mechanical stability and improves alignment for the epi-down mounted laser.

Figure 2A:
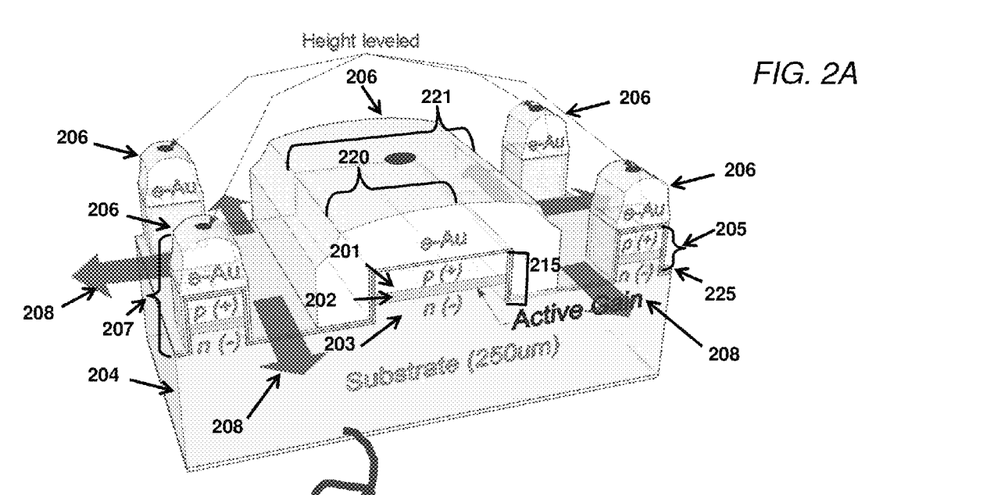
FIGS. 2A and 2B depict aspects of an epi-down mounted semiconductor ridge laser, with FIG. 2A depicting aspects of a semiconductor laser and deposited heat-spreading material layer in accordance with the present invention and FIG. 2B depicting the apparatus of FIG. 2A mounted with solder in an epi-down configuration on a heat sink in accordance with the present invention.
Figure 2B:
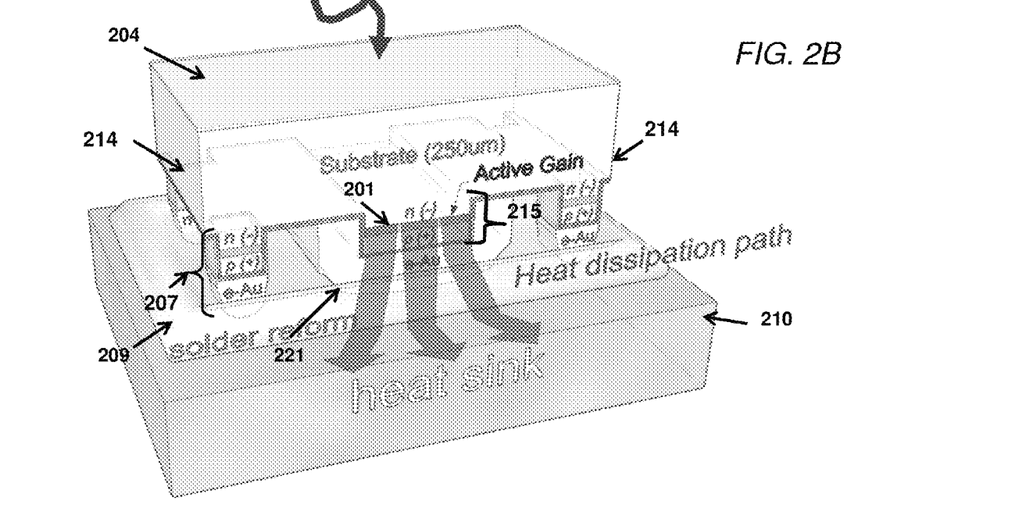

FIGS. 2A and 2B illustrate aspects of an exemplary embodiment of an epi-down mounted semiconductor laser in accordance with the present invention.

FIG. 2A illustrates aspects of a an exemplary laser apparatus configured for subsequent epi-down mounting on a heat sink in accordance with the present invention. As shown in FIG. 2A, such a laser includes a semiconductor laser chip which has one or more laser facets 215 and is composed of p(+) top optical clad/Active Gain/n(−) bottom optical clad layers 201, 202, and 203, respectively, grown on a substrate 204 having cleaved sidewalls 214. It is understood that while the figure illustrates a conventional semiconductor diode laser with a p(+)/Active Gain/n(−) configuration, other diode lasers may have the p(+) and n(−) regions inverted, and others may comprise an active gain region bounded by only n(+/−) or only p(+/−) regions. The chips can be patterned into ridge waveguides with widths as narrow as approximately the wavelength or as wide as 150 µm or more.

As described in more detail below, also on the substrate are a plurality of semiconductor posts 205 situated on either side of the laser at periodic intervals along the length of the laser ridge 220 formed by layers 201/202/203. As described in more detail below, posts 205 are spaced far enough apart from one another to provide solder reflow relief paths 208 so that the solder used to mount the laser on the heat sink will flow through the paths 208 and not onto the posts 205, the laser facets 215, or the cleaved substrate sidewalls 214. It should be noted that in the context of this description, "sidewall" does not refer to the laser ridge sidewall but to the cleaved substrate sidewalls 214; if solder were to contact the cleaved substrate sidewalls 214, the epi-down mounted laser device would be likely to be shorted in the same way as described above with respect to FIG. 1C.

An insulating dielectric layer 225 is deposited on the laser ridge 220 and posts 205, where the dielectric covers the top of posts 205 but not the top of laser ridge 220. Following the deposition of dielectric layer 225, in accordance with a preferred embodiment of the present invention, a conformal coating 206 of a heat-spreading material is disposed on the laser ridge and the posts, respectively, to form coated posts 207 and coated ridge 221. In most embodiments, the heat-spreading material will be a 3-6 µm thick layer of electroplated gold (e-Au), but irrespective of the material used, the thickness of the coating, if used, should be such that the height of all of the coated posts 207 is uniform and that their height is similar to or greater than the highest point of the coated laser ridge 221. In other embodiments, the heat-spreading material layer is not used, and in those embodiments, the posts themselves should be fabricated so that their height is similar to or greater than that of the highest point of the laser ridge.

As illustrated in FIG. 2B, in accordance with the present invention, this laser apparatus can then be inverted and secured to a heat sink 210 using solder applied to the top of the coated laser ridge 221 and the coated posts 207. As noted above, in conventional epi-down mounting, the solder flows when pressure is applied during mounting and often ends up on the laser facets or cleaved substrate sidewalls, which can block the optical emission from the device or cause short circuits to occur. In contrast, in the epi-down apparatus in accordance with the present invention, the solder relief paths 208 provided by coated posts 207 (or uncoated posts 205 if the heat-spreading material layer is not used) provide an adequate initially empty volume for the volume of solder displaced by the ridge and posts to occupy and flow through, providing controlled channels which direct the solder reform 209 away from the electrical contacts, laser facets, and cleaved substrate sidewalls of the device. At the same time, the presence of the e-Au layer 206 covering laser ridge 220 and forming coated laser ridge 221 ensures that the laser chip formed by layers 201/202/203 does not come directly into contact with the solder reform 209 and so does not interfere with its operation. Note that the e-Au deposition is only done on or near the laser ridge and posts regions, with the solder reflow paths 208 remaining uncoated. In addition, the uniform height of the coated laser ridge 220 and the uniform height of all of the coated posts 207 ensure that the apparatus is stable when it is inverted and mounted to the heat sink 210.

Figure 3:
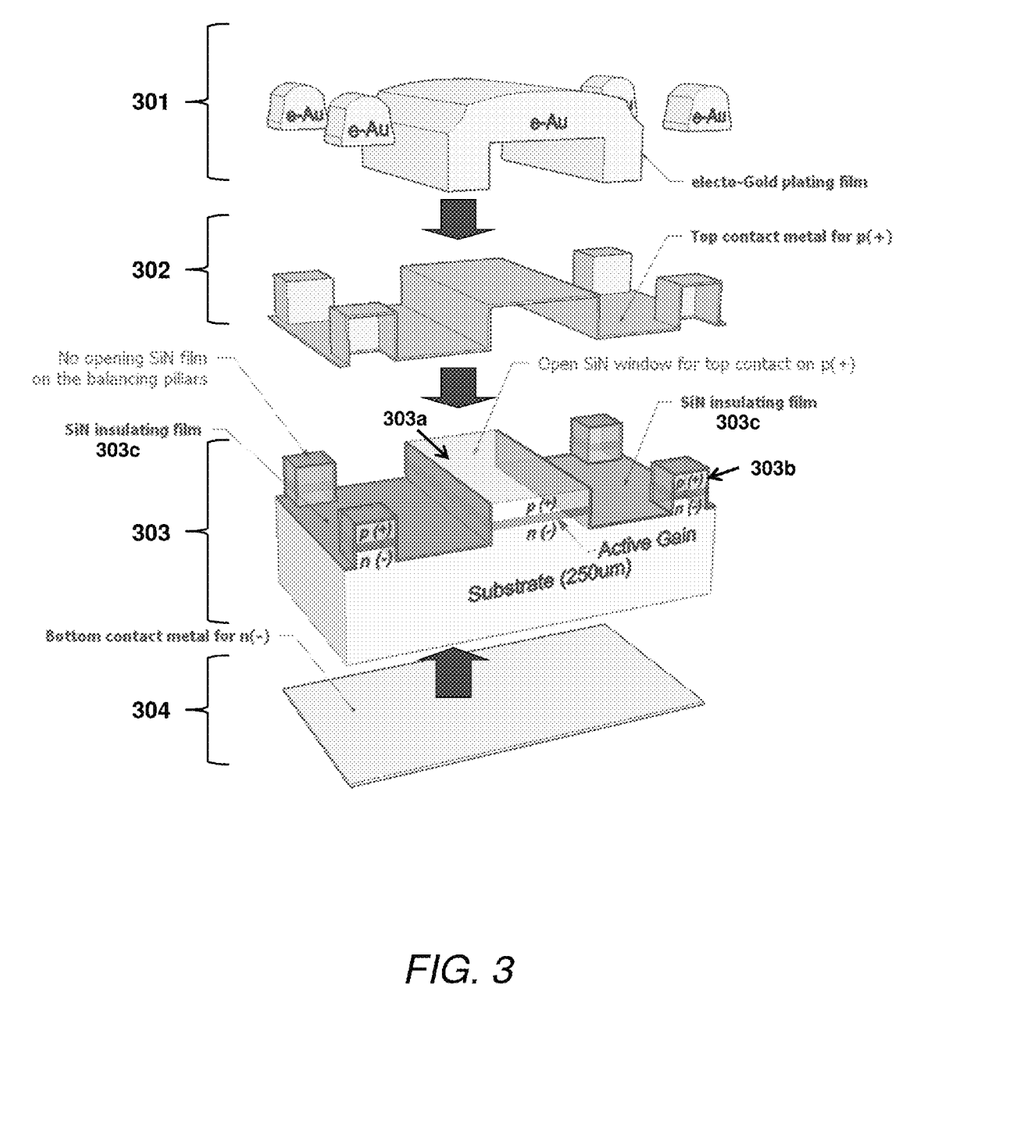
FIG. 3 is an exploded view further illustrating aspects of an epi-down mounted semiconductor ridge laser in accordance with the present invention.

FIG. 3 provides an exploded view of the laser apparatus shown in FIG. 2A, and provides additional detail regarding its structure.

As illustrated in FIG. 3, a laser apparatus configured in an exemplary embodiment for epi-down mounting on a heat sink in accordance with the present invention includes a layer 301 of a heat-spreading material, typically a film of electroplated gold (e-Au); a top metal layer 302 to contact the upper optical cladding layer (e.g., a p(+) layer in the exemplary configuration shown in FIG. 3) or a cap on top of the upper optical cladding layer; a semiconductor epitaxial layer 303 that includes top and bottom optical cladding regions and the active gain region and provides the material basis for patterning both the laser ridge and one or more posts on one or both sides of the laser ridge, a semiconductor laser ridge 303a that contains layers including a top optical cladding region, an active gain region, and a bottom optical cladding region (e.g., p(+)/Active Gain/n(−) layers in the exemplary configuration described in more detail above with respect to FIG. 2A); and a bottom contact metal layer 304 for contacting the bottom of the substrate. As noted above, the heat-spreading top layer 301 may be omitted in some embodiments, and in such cases, the topmost layer of the laser apparatus will be the top metal contact layer 302.

A first step in fabricating the laser apparatus configured for epi-down mounting in accordance with the present invention involves forming the semiconductor laser ridge 303a and posts 303b. In accordance with one embodiment of the present invention, a semiconductor epitaxial layer is deposited on the substrate, most commonly by molecular beam epitaxy or metalorganic chemical vapor deposition although other methods may be employed, which is then patterned into the semiconductor laser ridge 303a and posts 303b using any appropriate method, e.g., using optical lithography with an appropriate etch mask. Because both the laser ridge and the posts are processed at the same time from the same semiconductor epitaxial layer, the top of the ridge and the top of the posts are both aligned at the same height with respect to the substrate. This provides a solid mechanical stability and flatness of the bond between the ridge and the heat sink.

Once the semiconductor epitaxial layer is patterned into laser ridge 303a and posts 303b, an insulating film, such as a thin SiN film 303c, is deposited on the top and sides of the posts and on the sides of the laser ridge. The insulating layer on top of the posts prevents current flow into the posts.

After the insulating film 303c is deposited, top contact metal layer 302 is deposited on the structure. Since the insulating film does not cover the top of the laser ridge, this provides an electrical contact for current flow into the laser ridge.

A layer of heat-spreading material 301 (e.g., the e-Au layer shown in the Figure) can then optionally be deposited on top of the contact metal layer such that it covers the laser ridge 303a and posts 303b, with the deposition being accomplished using any appropriate method such as optical lithography. As noted above, because the laser ridge and posts are formed from the same semiconductor layer grown on the substrate, they are aligned at the same height with respect to the substrate. Similarly, the heat-spreading layer (e.g., e-Au), if present, is deposited on both the laser ridge and the posts in a single step, so that the maximum height of each coated post remains about the same as the maximum height of the coated laser ridge. In most cases, the heat-spreading layer is deposited on the laser ridge and posts, and then is patterned to form most of the solder relief channel volume between the posts and the laser ridge and between the posts themselves as described above. The invention's high yield is achieved by introducing the posts to form the relief channels that keep excessive molten solder away from the facets and cleaved substrate sidewalls and ensure the device is mechanically stable during the epi-down mounting. In addition, as long as it is thicker than the solder film, the heat-spreading material layer can have the further advantage of keeping the laser's active gain region away from the interface of the heat-spreading layer and solder material to prevent molten solder from touching the facets and/or cleaved sidewalls of substrate. However, as noted above, use of a heat-spreading layer on the posts and laser ridge is optional and may be omitted, especially if the top of the cladding layer is thicker than the thickness of solder on the heat sink.

In any case, while other ridge laser devices may include additional steps or layer depositions, for example, the patterning of a grating for distributed feedback devices, a central feature of the invention is that the posts and the ridge are of approximately the same height. In most cases, this is accomplished by the posts being processed in parallel with the laser ridge, but any other appropriate method of fabricating the ridge and the posts may be used so long as both the posts and the ridge have nearly the same height.

Figure 4:
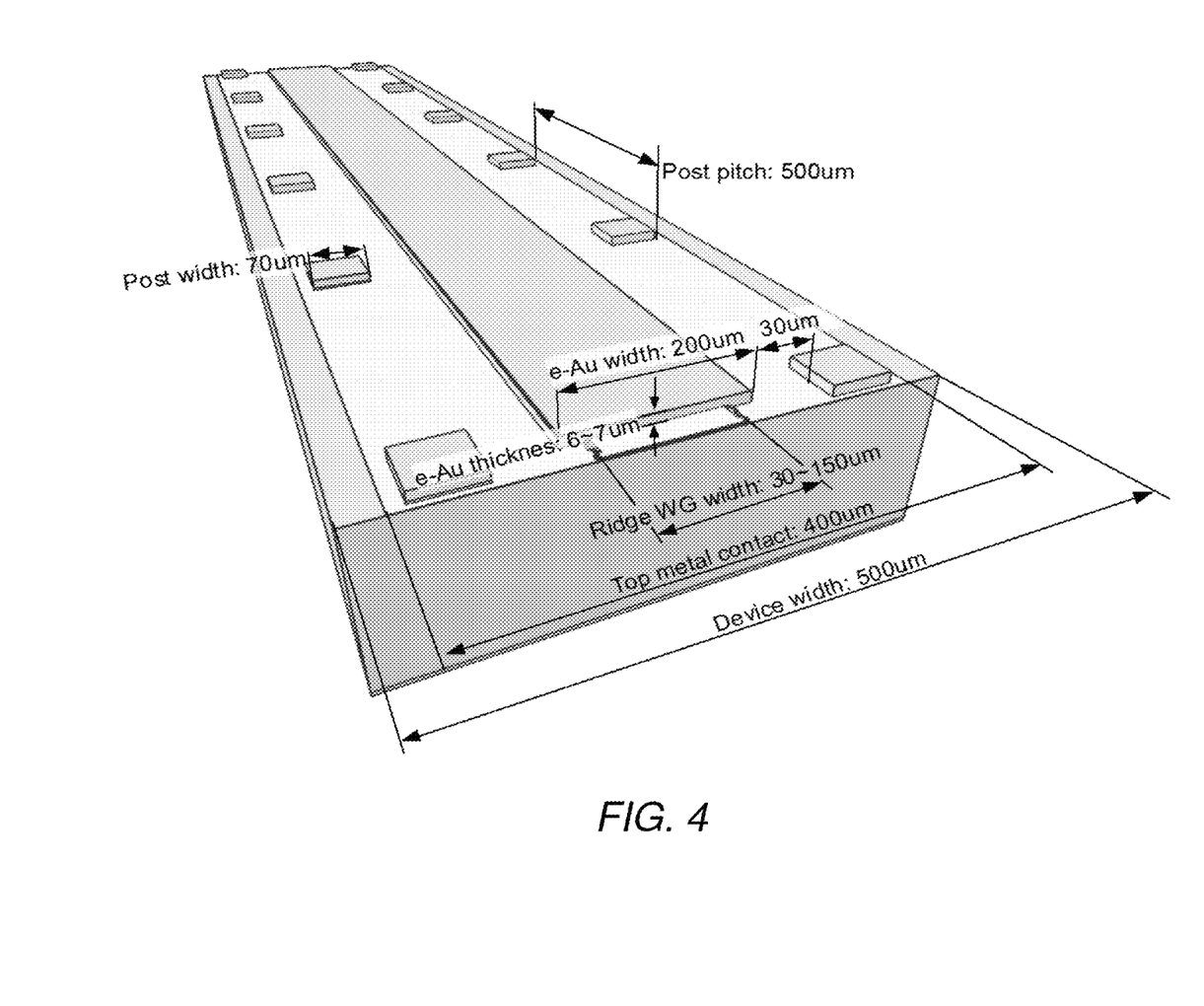
FIG. 4 further illustrates aspects of an epi-down mounted semiconductor ridge laser in accordance with the present invention.

FIG. 4 is a schematic diagram illustrating parameters of an exemplary embodiment of a laser apparatus configured for epi-down mounting on a heat sink in accordance with the present invention. The exemplary embodiment shown in FIG. 4 illustrates a laser apparatus formed on a substrate having a width of about 500 μm. The laser ridge waveguide (WG) typically has a width ranging between about the order of the wavelength to about 150 μm. The posts formed from the semiconductor material as described above are preferably etched to be square, with an exemplary width of about 70 μm on a side, though oval or circular shapes having a typical maximum diameter of about 100 μm or less should provide a similar advantage and may also be used. Irrespective of the shape, the size of the posts should be such that they comprise only a small fraction of the area contacting the heat sink compared to the laser ridge. The posts are preferably situated at equal distances from either side of the laser ridge, e.g., about 30 μm from the laser ridge, and are periodically located along the length of the laser ridge, e.g., at a period of about 500 μm. The apparatus also includes a top metal contact layer having an exemplary total width of about 400 μm that covers both the laser ridge and the posts as described above.

As described above, a laser apparatus in accordance with the present invention also preferably includes a heat-spreading material, typically e-Au, deposited on the laser ridge and posts so that the maximum height above the substrate of posts is the same or greater than the maximum height of the laser ridge. In the exemplary embodiment shown in FIG. 4, this e-Au layer has a thickness of about 4-6 μm. This height defines the thickness of the relief area for the flowing solder and is chosen to be a few microns greater than the thickness of the solder before melting. This layer may be omitted or other materials having other thicknesses can be used as appropriate, so long as the height of the posts is about the same or greater than the height of the laser ridge and a sufficient relief area is maintained. Following deposition of the optional heat-spreading layer, the apparatus is further etched so that the width of the heat-spreading coating on the laser ridge waveguide is preferably about 200 μm and that the distance between the heat-spreading material layer on the laser ridge and the posts is about 30 μm to form the solder relief channels described above.

As noted above, aspects of the present invention may also be applied to surface-emitting architectures such as such as VCSELs, VECSELs, and LEDs.

Figure 6A:
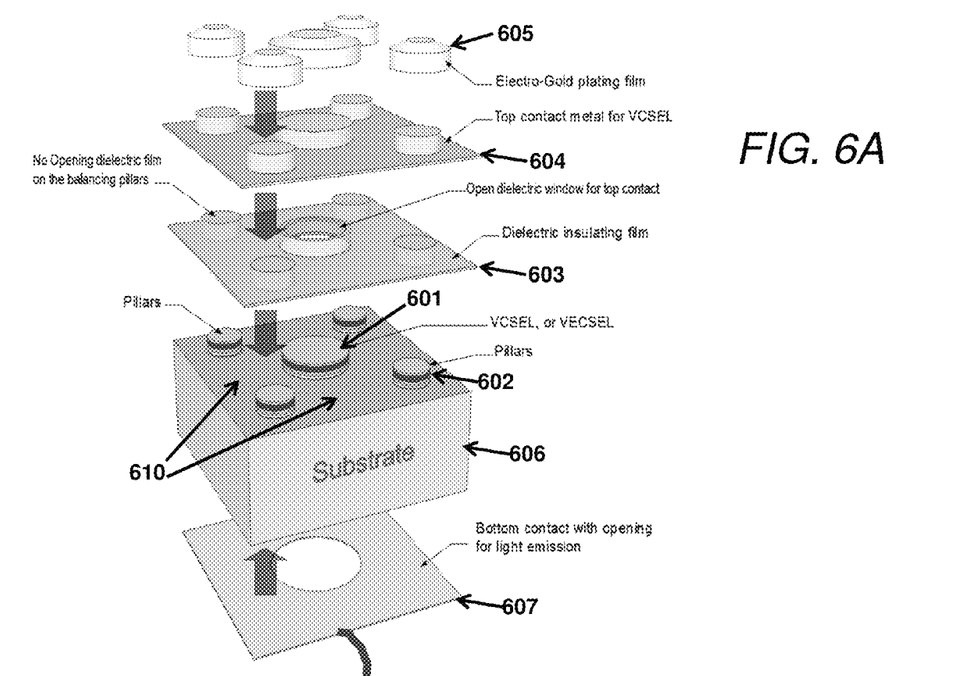
FIGS. 6A and 6B illustrate aspects of an epi-down mounted semiconductor surface-emitting laser in accordance with the present invention, with FIG. 6A depicting aspects of a surface-emitting laser apparatus having a heat-spreading material layer in accordance with the present invention and FIG. 6B depicting the apparatus of FIG. 6A mounted with solder in an epi-down configuration on a heat sink in accordance with the present invention.
Figure 6B:
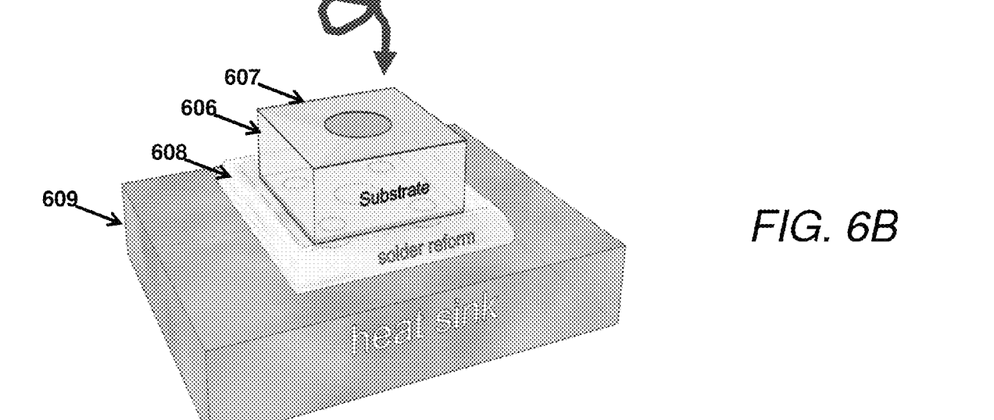

Aspects of an exemplary embodiment of the present invention used with such surface emitting lasers are illustrated in FIGS. 6A and 6B, with FIG. 6A depicting aspects of a vertical emitting laser apparatus with deposited heat-spreading material layer in accordance with the present invention and FIG. 6B depicting the apparatus of FIG. 6A mounted with solder in an epi-down configuration on a heat sink in accordance with the present invention.

As illustrated in FIG. 6A, one or more vertical emitters 601 (labeled as VCSEL or VECSEL in the FIGURE) and pillars 602 are formed on a substrate 606 in a manner similar to that described above with respect to an edge-emitting ridge waveguide laser. As illustrated in FIG. 6, vertical emitter 601 frequently has an approximately circular shape and emits light from the planar surface of the device rather than from an edge facet. Posts 602 are spaced periodically or in some other regular arrangement around the perimeter of the active area of the emitters 601, with channels 610 for the flow of the molten solder located between them as in the edge-emitter geometry described above. As with the ridge waveguide emitter embodiment described above, a dielectric insulating film 603 may be disposed on the emitters 601 and pillars such that the pillars 602 are completely covered with the dielectric film while the top surface of the emitter is not covered. In the case of a bottom-emitting VCSEL, a top contact metal layer 604 is conformingly disposed on the dielectric film so that the shape of vertical emitter 601 and pillars 602 is maintained. In the case of a top-emitting VCSEL or electrically-pumped VECSEL, an annular top contact is required, which is not shown in FIG. 6A. Finally, as with the edge-emitter embodiment described above, a heat-spreading material layer 605 (e.g., electro-plated gold film shown in the FIGURE) can optionally be disposed on the top and side surfaces of the emitter 601 and pillars 602, with the maximum height of the coated pillars being is about the same as the maximum height of the coated emitter.

As shown in FIG. 6B, the laser apparatus of FIG. 6A can then be inverted and secured to a heat sink 609 using solder applied to the top of the vertical emitter 601 and posts 602. As with the embodiment described above with respect to FIGS. 2A and 2B, the presence of the posts provides a relief flow path for the solder and prevents the solder reform from interfering with the operation of the device.

Single devices or arrays of vertical emitters may be mounted epi-down in this manner. In the case of widely-spaced arrays, the posts may surround each individual emitter in the array. In other embodiments, if the array period may be suitable for the array elements themselves to function as posts, and in such embodiments, additional posts may be incorporated beyond the outer perimeter of the overall array.

The invention may be applied to any structure in which a semiconductor light-emitter is mounted epitaxial-side-down to a substrate. The substrate need not function primarily as a heat sink, as in the example of a III-V semiconductor laser that is mounted epitaxial-side down onto a silicon or silicon-on-insulator (SOI) chip in order to allow integration of the III-V light emitter with other optoelectronic devices that are processed into or mounted on the silicon chip.

Figure 7:
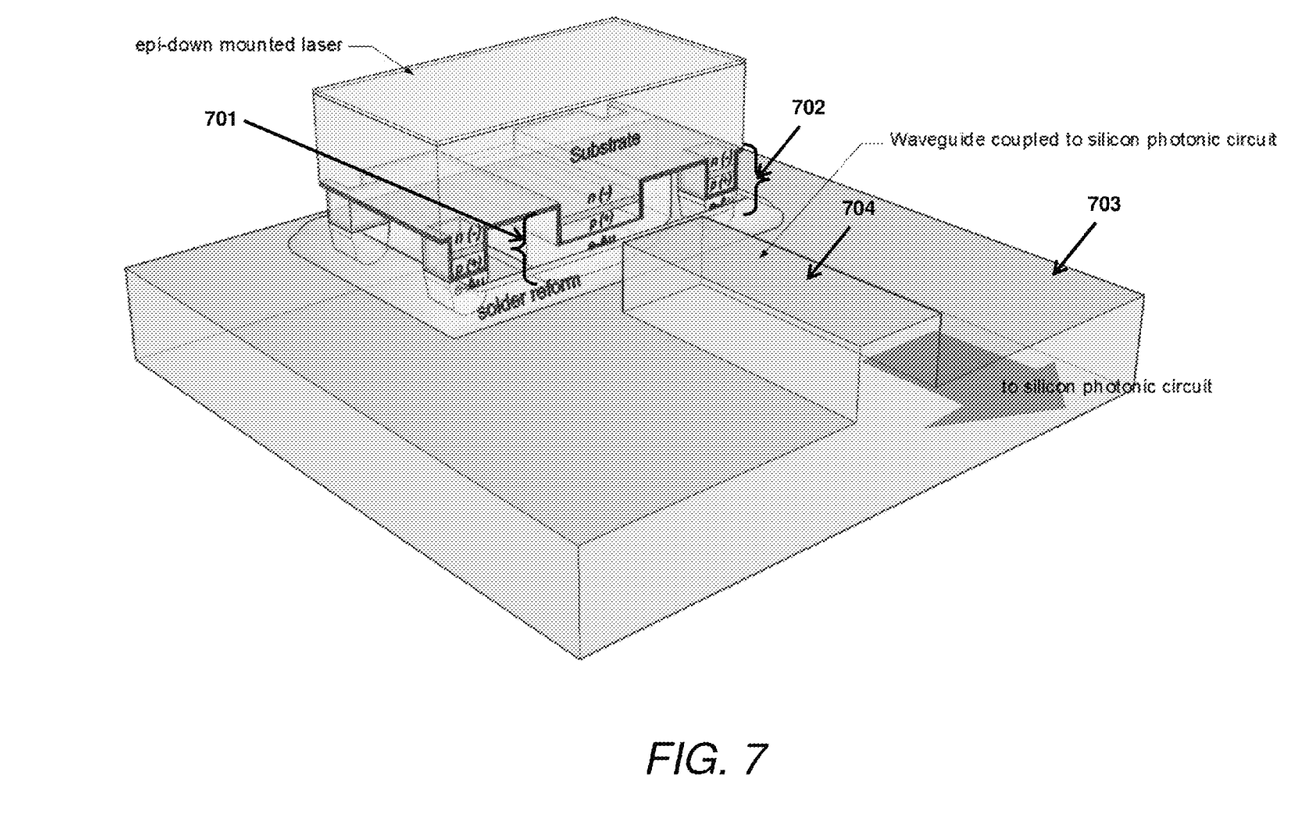
FIG. 7 illustrates aspects of a semiconductor ridge laser mounted epi-down onto a silicon-on-insulator (SOI) chip for butt-coupling into a low-loss silicon waveguide in accordance with the present invention.

FIG. 7 illustrates aspects of a III-V edge-emitting ridge diode laser having an e-Au-coated laser ridge 701 and e-Au coated posts 702 as described above that is mounted epitaxial-side-down to an SOI chip 703 in accordance with the invention. In the embodiment illustrated in FIG. 7, the laser is mounted in a manner such that the output of the III-V diode is butt-coupled into a low-loss silicon waveguide 704. In this embodiment, the light transmission is accomplished via an air gap of a few micrometers by aligning the SOI waveguide with one facet of the laser ridge and using the appropriate anti-reflection coatings to minimize the effects of parasitic resonating cavities.

Figure 5:
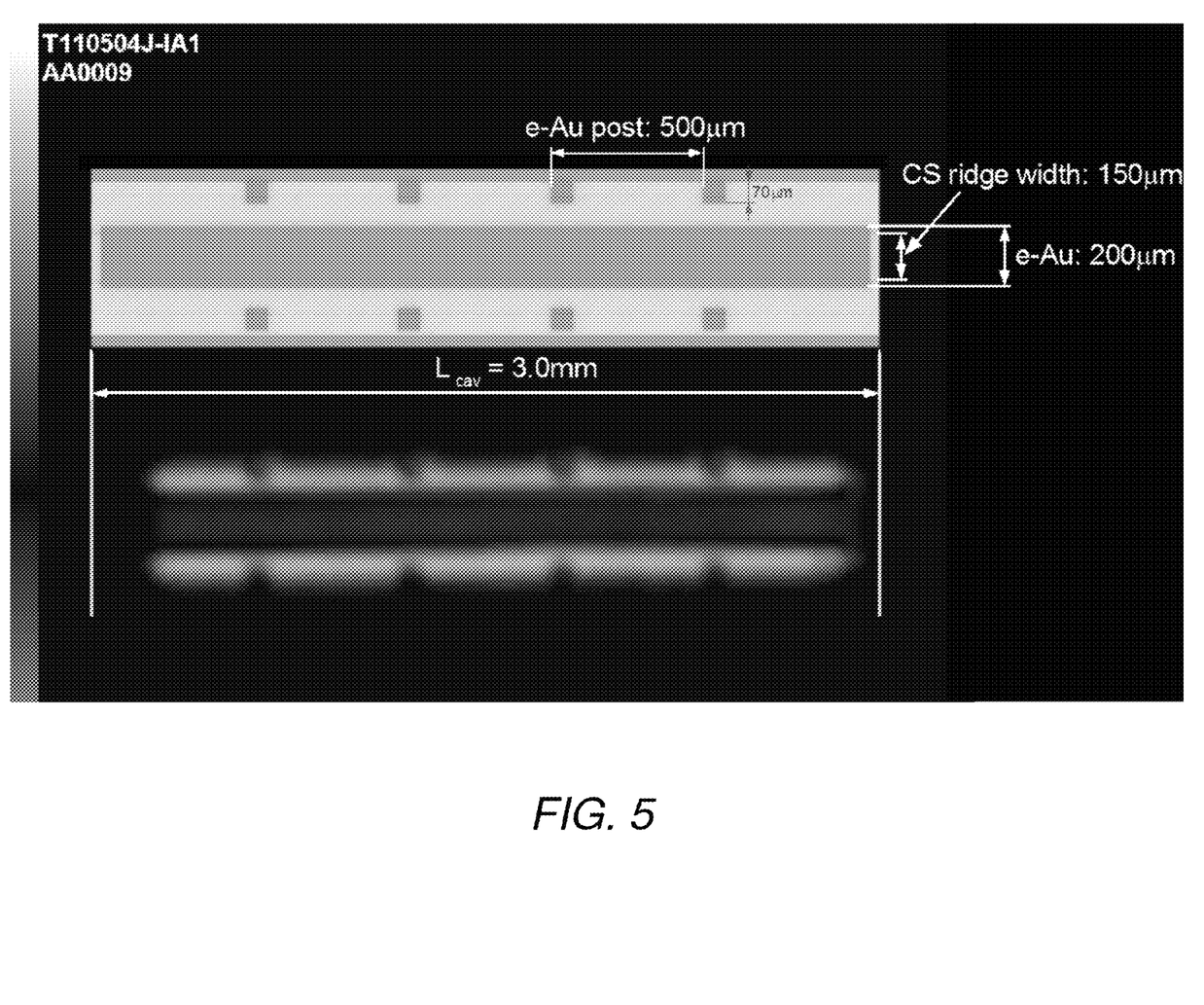
FIG. 5 further illustrates aspects of an epi-down mounted semiconductor ridge laser in accordance with the present invention. The upper half is schematic, while the lower half illustrates a scanning acoustic microscopy (SAM) image of an interband cascade laser with the same ridge and post pattern. In the color map used in the lower half, bonded areas appear gray or dark gray, while any delaminations would appear as bright white.

The invention has been reduced to practice by applying it to the epi-side-down mounting of both interband cascade lasers (ICLs) and quantum cascade lasers (QCLs) emitting in mid-IR. Each laser was soldered onto a commercially available heat sink using a 4 μm thick layer of Au/Sn solder. The laser was positioned on the heat sink and then overlaid with a 500 μm thick sapphire bar that distributed a point pressure of 100 psi uniformly across the laser during the soldering. The lower half of FIG. 5 shows a scanning acoustic microscopy (SAM) of an ICL whose ridge and post pattern are shown schematically in the upper half, which is effectively a top view of the schematic in FIG. 4. The SAM interface scan, which is a technique for evaluating the integrity of solder bonds, revealed no significant voids in the final fabricated structure.

In reductions of the invention to practice carried out thus far at the Naval Research Laboratory (NRL), the mounting yield has approached 100% for both interband and quantum cascade lasers and for both narrow and wide ridges. The exact yield cannot be quantified precisely, since even for conventional epi-up processing a small number of devices perform sub-optimally. However, the number of such devices was no greater in the present studies, and in no case was there any obvious indication that any sub-optimal performance was attributable to the epi-down mounting.

Figure 8:
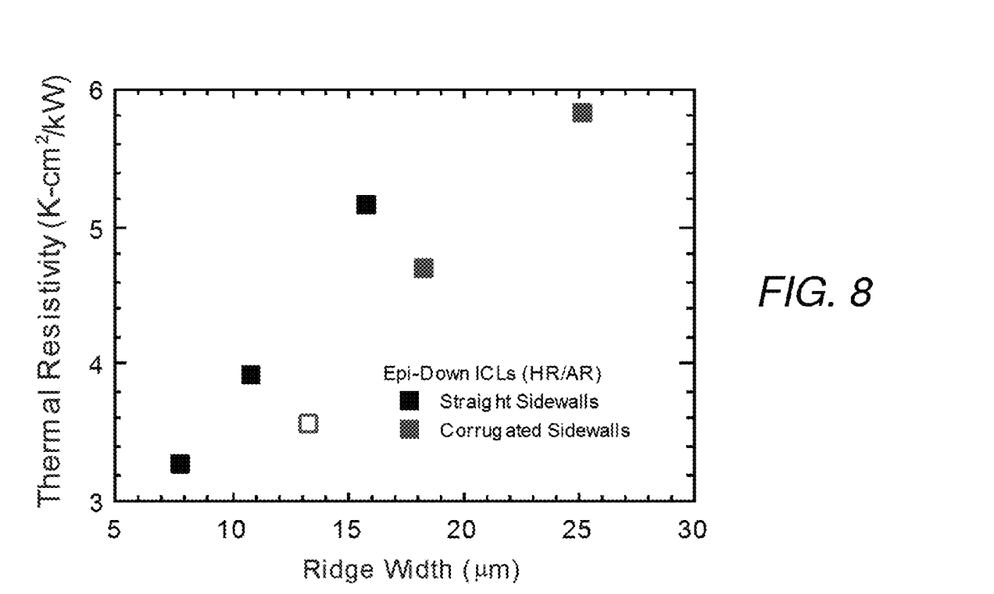
FIG. 8 is a plot illustrating thermal resistivity as a function of ridge width for a series of interband cascade lasers with both straight and corrugated sidewalls.

FIG. 8 plots the measured thermal resistivities as a function of ridge width for a series of ICLs with both straight and corrugated sidewalls that were mounted epi-down using the invention. These values were determined from a comparison of emission wavelength vs. temperature for short-pulse/low-duty-cycle operation to the wavelength at fixed temperature as a function of injection current for continuous wave (cw) operation. The results agree well with those modeled by the finite-element method (using the COMSOL package) assuming an ideal thermal bond and they are lower than values measured previously in our laboratory for similar ridges mounted epi-up with gold electroplating.

Figure 9:
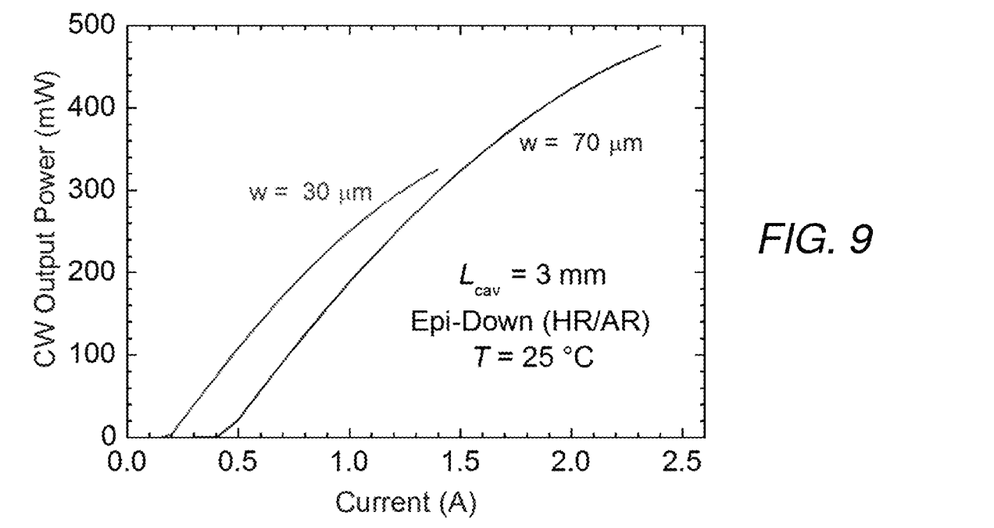
FIG. 9 is a plot illustrating aspects of continuous wave (cw) output power as a function of input current for interband cascade lasers with two ridge widths that were mounted epi-down in accordance with the present invention.

FIG. 9 plots the mid-IR cw output powers vs. injection currents (L-I) at a temperature of 25° C. for two ICLs with ridge widths of 30 μm and 70 μm, which were also mounted epi-down using the invention. The maximum cw output power of 470 mW is a record for ICLs operating at room temperature.

Figure 10:
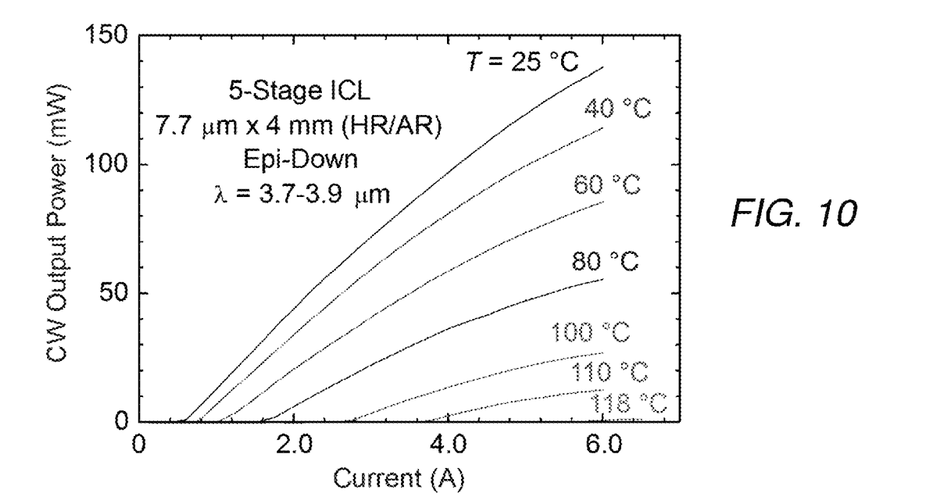
FIG. 10 is a plot illustrating cw output power as a function of current at different temperatures ranging from 20° C. to 118° C. for an exemplary interband cascade semiconductor laser having an epi-down mounting configuration in accordance with the present invention.

FIG. 10 plots the L-I characteristics of an epi-down-mounted 7.7-μm-wide ICL ridge at a series of temperatures. The maximum operating temperature of 118° C. is also a record for semiconductor lasers emitting in its wavelength range of λ≈3.9 μm.

Figure 11:
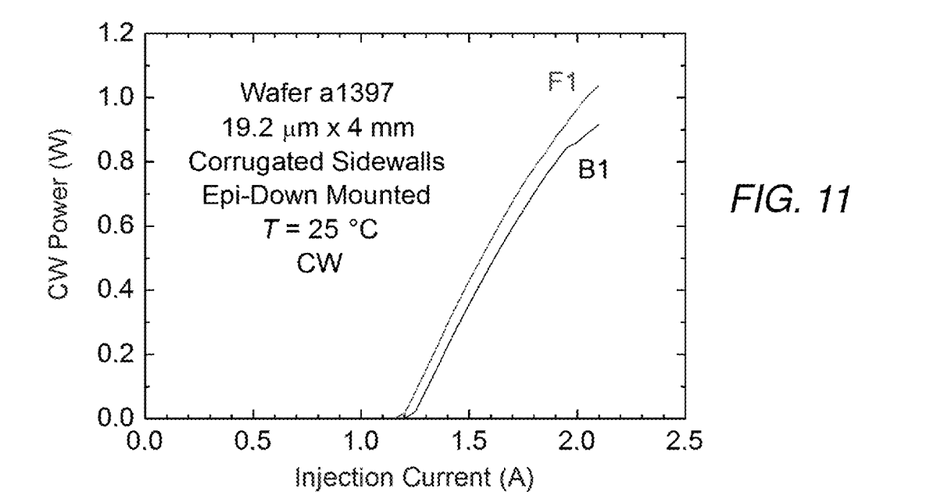
FIG. 11 is a plot illustrating cw output power as a function of current at different temperatures ranging from 20° C. to 118° C. for two exemplary quantum cascade lasers having epi-down mounting configurations in accordance with the present invention.

Finally, FIG. 11 plots the cw L-I characteristics at 25° C. for two QCLs that were mounted epi-down using the invention. More than 1 W of power is generated by one of the lasers, and the thermal characteristics again compare quite favorably to those expected for a near-ideal solder bond.

In summary, the invention provides an improved method for mounting semiconductor ridge lasers epitaxial side down with low thermal resistance and higher yield than other approaches that have been reported previously. The most important element of the invention is the introduction of posts that have nearly the same height as the laser ridge since they are processed at the same time. The posts serve the dual role of providing mechanical stability during mounting, and providing solder relief pathways in between the posts to prevent the accumulation of excess solder or its undesired extrusion onto the laser facets or sidewalls that can cause blockage of the emission or electrical shorting.

Although particular embodiments, aspects, and features have been described and illustrated, one skilled in the art would readily appreciate that the invention described herein is not limited to only those embodiments, aspects, and features but also contemplates any and all modifications within the spirit and scope of the underlying invention described and claimed herein, and such combinations and embodiments are within the scope of the present disclosure.

For example, the description provided above assumes a straightforward single laser ridge structure. However, the invention may be applied just as effectively and using obvious generalizations to more complicated semiconductor laser geometries such as arrays of ridges, ridges incorporating distributed feedback gratings, ring lasers, etc. We have also described the preferable embodiment that includes a heat-spreading material layer such as e-Au, although other embodiments of the invention may exclude this layer.

What is claimed is:

1. A light-emitting apparatus mounted epitaxial-side-down on a mounting surface, comprising:
   a semiconductor light-emitting structure formed on a substrate; and
   a plurality of spaced semiconductor posts situated on the substrate along each side of the semiconductor light-emitting structure,
      the plurality of posts on each side of the semiconductor light-emitting structure being separated from the semiconductor light-emitting structure by a corresponding first channel between the semiconductor light-emitting structure and the plurality of posts, and further being separated from one another by a plurality of corresponding second channels between the posts,
      an insulating film being deposited on the posts and on side surfaces of the semiconductor light-emitting structure, and
      a top metal contact layer being deposited on top of the insulating film and on the top surface of the semiconductor light-emitting structure to form coated posts and a coated semiconductor light-emitting structure,
      the posts, the insulating film, and the top metal contact layer being configured so that the coated posts have a maximum height with respect to the substrate approximately equal to a maximum height of the coated semiconductor light-emitting structure;
   wherein the light-emitting apparatus is mounted epitaxial-side-down on the mounting surface by means of solder applied to the plurality of coated posts and the coated semiconductor light-emitting structure; and
   wherein the first and second channels provide an adequate empty volume for a volume of solder displaced by the coated semiconductor light-emitting structure and the coated posts to occupy and flow through without the solder contacting a sidewall of the substrate or end facet of the semiconductor light-emitting structure.

2. The light-emitting apparatus according to claim 1, wherein the semiconductor light-emitting structure is a semiconductor laser structure.

3. The light-emitting apparatus according to claim 2, wherein the semiconductor laser structure is a laser ridge waveguide emitter.

4. The light-emitting apparatus according to claim 3, wherein a laser ridge of the laser ridge waveguide emitter has a width of about 1 to about 150 μm; and further wherein at least one of the plurality of posts is situated about 10-50 μm from an edge of the laser ridge.

5. The light-emitting apparatus according to claim 2, wherein the semiconductor laser structure comprises a vertical cavity surface-emitting laser.

6. The light-emitting apparatus according to claim 2, wherein the semiconductor laser structure comprises a vertical-external-cavity surface-emitting-laser.

7. The light-emitting apparatus according to claim 2, wherein the semiconductor laser structure comprises an optically pumped semiconductor laser.

8. The light-emitting apparatus according to claim 1, wherein the semiconductor light-emitting structure comprises a light-emitting diode.

9. The light-emitting apparatus according to claim 1, wherein the semiconductor light-emitting structure comprises a semiconductor optical amplifier.

10. The light-emitting apparatus according to claim 1, wherein the semiconductor light-emitting structure comprises a semiconductor superluminescent emitter.

11. The light-emitting apparatus according to claim 1, wherein the light-emitting apparatus comprises an array of semiconductor light-emitting structures mounted epitaxial-side-down on the mounting surface.

12. The light-emitting apparatus according to claim 1, wherein the mounting surface is a heat sink.

13. The light-emitting apparatus according to claim 1, wherein the mounting surface is a silicon chip.

14. The light-emitting apparatus according to claim 1, wherein the mounting surface is a silicon-on-insulator (SOI) chip.

15. The light-emitting apparatus according to claim 14, wherein the light-emitting apparatus is mounted onto a silicon-on-insulator (SOI) chip such that an output of the semiconductor light-emitting structure is butt-coupled into a low-loss silicon waveguide.

16. The light-emitting apparatus according to claim 1, wherein the semiconductor light-emitting structure and the plurality of posts are further coated with a heat-spreading material layer, a thickness of the heat-spreading material being configured such that all of the posts and the coated semiconductor light-emitting structure have approximately the same height.

17. The light-emitting apparatus according to claim 16, wherein the heat-spreading material layer is a layer of electroplated gold (e-Au) having a thickness of about 3 to about 6 μm.

18. The light-emitting apparatus according to claim 1, wherein the plurality of posts is formed from semiconductor material.

19. The light-emitting apparatus according to claim 18, wherein the plurality of posts and the semiconductor light-emitting structure comprise regions of a single semiconductor material patterned on the substrate.

20. The light-emitting apparatus according to claim 1, wherein the plurality of posts and the semiconductor light-emitting structure are patterned using optical lithography and an etch mask.

21. The light-emitting apparatus according to claim 1, wherein the plurality of posts are periodically located along each side of the semiconductor light-emitting structure at a period of about 100-1000 μm.

22. The light-emitting apparatus according to claim 1, wherein at least one of the plurality of posts is an approximately square post having a length of about 20-100 μm on a side.

23. The light-emitting apparatus according to claim 1, wherein at least one of the plurality of posts is an approximately oval post having a maximum diameter of about 50-200 μm.

* * * * *